(12) United States Patent
Mizutani

(10) Patent No.: US 6,340,906 B1
(45) Date of Patent: Jan. 22, 2002

(54) FLIP-FLOP CONTROL CIRCUIT, PROCESSOR, AND METHOD FOR OPERATING PROCESSOR

(75) Inventor: Yasushi Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/605,369

(22) Filed: Jun. 29, 2000

(30) Foreign Application Priority Data

Nov. 11, 1999 (JP) .............................. 11-321163

(51) Int. Cl.⁷ ................................................ H03K 3/02
(52) U.S. Cl. ....................................................... 327/198
(58) Field of Search ................................. 327/107, 142, 327/151, 159, 160, 166, 176, 190, 199, 339, 12, 48

(56) References Cited

U.S. PATENT DOCUMENTS

| | | | | |
|---|---|---|---|---|
| 5,789,985 A | * | 8/1998 | Yamauchi et al. | 331/1 A |
| 5,805,532 A | * | 9/1998 | Murakami | 368/113 |
| 5,963,068 A | * | 10/1999 | Hardesty et al. | 327/156 |
| 5,973,523 A | * | 10/1999 | Kusumoto et al. | 327/146 |
| 6,081,303 A | * | 6/2000 | Kim | 348/797 |

FOREIGN PATENT DOCUMENTS

| | | |
|---|---|---|
| JP | 63-268015 | 11/1988 |
| JP | 8-030351 | 2/1996 |
| JP | 8-286780 | 11/1996 |

* cited by examiner

*Primary Examiner*—My-Trang Nu Ton
(74) *Attorney, Agent, or Firm*—Arent Fox Kintner Plotkin & Kahn, PLLC

(57) ABSTRACT

A flip-flop control circuit for reducing low-frequency power supply noise, a processor incorporating the flip-flop control circuit, and a method for operating the processor are disclosed. The flip-flop (FF) control circuit, which is connected to a digital circuit having a plurality of FFs, includes: a clock generating circuit which generates a first clock pulse signal of a base frequency synchronized to the frequency of an oscillator such as a crystal oscillator; a clock selecting circuit which generates from the first clock pulse signal a high-speed processing second clock pulse signal having a frequency higher than the base frequency, and outputs the first or second clock pulse signal in accordance with a control signal; a counter circuit which, when determining the states of the plurality of flip-flops, sets the control signal and starts counting the first or second clock pulse signal upon receiving an activation signal thereof, and clears the setting of the control signal upon expiration of a predetermined time; and a clock distributing circuit which distributes the first or second clock pulse signal to the plurality of flip-flops.

8 Claims, 5 Drawing Sheets

FLIP-FLOP CONTROL CIRCUIT, PROCESSOR, AND METHOD FOR OPERATING PROCESSOR

BACKGROUND OF THE INVENTION

1. Field of the Invention

The present invention relates to a flip-flop control circuit for reducing low-frequency power supply noise, a processor incorporating the flip-flop control circuit, and a method for operating the processor.

2. Description of the Related Art

FIG. 5 is a diagram of a power supply circuit commonly used in a computer comprising a CMOS LSI. In FIG. 5, a wiring section 53 having resistance R and inductance L and a bypass capacitor 54 having capacitance C are interposed between the power supply unit 51 and the LSI 52. The R component is small and is unaffected by alternating current. For the L component, the wiring line is reduced in length and increased in thickness to reduce the effects of noise. For the C component, the capacitance of the electrolytic capacitor is increased to reduce the effects of noise. However, in this power supply circuit, there is a limit to how far the noise can be reduced because of limitations in component placement.

In computers comprising CMOS LSIs, there is a need to achieve faster operating speeds and lower power consumption. To address these requirements, Japanese Unexamined Patent Publication No. 8-286780 discloses a clock circuit, a processor, and a method for operating the processor, in which the computer is operated with low-frequency clock pulses in normal mode and during a finite period when switching from the normal mode to low power consumption mode and, after switching to the low power consumption mode, the computer is operated with high-frequency clock pulses.

It should also be noted that, in computers comprising CMOS LSIs, current consumption has increasing as their operating speeds and circuit densities increase.

However, in the clock circuit, the processor, and the method for operating the processor disclosed in the above-cited Japanese Unexamined Patent Publication No. 8-286780, if a clock pulse or reset signal is supplied at a time to flip-flops (FFs) in the LSI constituting the computer when determining the states of the FFS, there arises the problem that the consumption current of the LSI increases instantaneously, causing the computer to malfunction.

More specifically, when scanning FFS in the computer, or at the time of initial program load (IPL), gated clocks to be supplied to the flip-flops (FFs) in the LSI are started or stopped or resetting of the FFs is performed; at this time, a large transient current flows and, due to the inductance component of the power supply system, much AC power supply noise is caused, causing the supply voltage to fluctuate and adversely affecting the LSI, resulting in the problem that the computer malfunctions and the reliability is degraded.

The term "scan" here includes "scan in" where the outputs of all FFs in an LSI are set or reset, as when testing the LSI, and "scan out" where the outputs of the FFs are read out after the scan in. On the other hand, IPL refers to an initialization procedure in which a program for causing a computer's operating system (OS) to commence operation is loaded from an external storage device into an internal memory of the computer by operating the console containing the computer's CPU (central processing unit). As for the starting/stopping of gated clocks, enabling the supply of clock pulses to the FFs in the LSI is described as starting the gated clocks, while stopping the supply of clock pluses is described as stopping the gated clocks. Here, the FFs contained in the LSI include those used as latches.

SUMMARY OF THE INVENTION

It is, accordingly, an object of the present invention to resolve the above problems and provide a flip-flop control circuit for reducing low-frequency power supply noise, a processor incorporating the flip-flop control circuit, and a method for operating the processor.

According to a first embodiment of the invention that achieves the above object, there is provided a flip-flop control circuit, connected to a digital circuit having a plurality of flip-flops, for supplying the digital circuit with a signal that determines the states of the plurality of flip-flops, comprising: a clock generating circuit which generates a first clock pulse signal of a base frequency; a clock selecting circuit which receives the first clock pulse signal from the clock generating circuit, and which generates from the received first clock pulse signal a high-speed processing second clock pulse signal having a frequency higher than the base frequency, and outputs the first clock pulse signal or the second clock pulse signal in accordance with a control signal input thereto; a counter circuit which receives the first clock pulse signal or the second clock pulse signal from the clock selecting circuit, and which, when determining the states of the plurality of flip-flops, sets the control signal and starts counting the received clock pulse signal upon receiving an activation signal thereof, and clears the setting of the control signal upon expiration of a predetermined time; and a clock distributing circuit which receives the first clock pulse signal or the second clock pulse signal from the clock selecting circuit, and which distributes the received clock pulse signal to the plurality of flip-flops.

In the configuration of the first embodiment described above, after the activation signal is issued to determine the states of the plurality of flip-flops, the first clock pulse signal of the base frequency is supplied to the plurality of flip-flops until a predetermined time elapses and, after the predetermined time has elapsed, the high-speed processing second clock pulse signal having a frequency higher than the base frequency is supplied to the plurality of flip-flops; accordingly, since the high-frequency clock pulse signal is not supplied at one time to the plurality of flip-flops, an instantaneous increase in the current consumption is prevented and, as a result, low-frequency power supply noise is reduced.

According to a second embodiment of the invention that achieves the above object, there is provided a flip-flop control circuit, connected to a digital circuit having a plurality of flip-flops, for supplying the digital circuit with a signal that determines the states of the plurality of flip-flops, comprising: a clock generating circuit which generates a clock pulse signal of a base frequency; a counter circuit which receives the clock pulse signal from the clock generating circuit, and which, when determining the states of the plurality of flip-flops, sets a control signal and starts counting the received clock pulse signal upon receiving an activation signal thereof, and changes the setting of the control signal at each expiration of a predetermined time; and a clock distributing circuit which receives the clock pulse signal from the clock generating circuit, and which distributes the clock pulse signal to the plurality of flip-flops in sequence in accordance with the control signal.

In the configuration of the second embodiment described above, since, after issuing the activation signal to determine the states of the plurality of flip-flops, the clock pulse signal is distributed in sequence to the plurality of flip-flops as a predetermined time elapses, the clock pulse signal is not supplied at a time to the plurality of flip-flops; this prevents an instantaneous increase in the current consumption and, hence, reduces low-frequency power supply noise.

According to a third embodiment of the invention that achieves the above object, there is provided a flip-flop control circuit, connected to a digital circuit having a plurality of flip-flops, for supplying the digital circuit with a signal that determines the states of the plurality of flip-flops, comprising: a clock generating circuit which generates a clock pulse signal of a base frequency; a counter circuit which receives the clock pulse signal from the clock generating circuit, and which, when determining the states of the plurality of flip-flops, sets a control signal and starts counting the received clock pulse signal upon receiving an activation signal thereof, and changes the setting of the control signal at each expiration of a predetermined time; and a reset signal distributing circuit which distributes a reset signal to the plurality of flip-flops in sequence in accordance with the control signal.

In the configuration of the third embodiment described above, since, after issuing the activation signal to determine the states of the plurality of flip-flops, the reset signal is distributed in sequence to the plurality of flip-flops as a predetermined time elapses, the reset signal is not supplied at a time to the plurality of flip-flops; this prevents an instantaneous increase in the current consumption and, hence, reduces low-frequency power supply noise.

In the flip-flop control circuit according to the first, second, or third embodiment of the invention described above, the digital circuit comprises at least one LSI.

According to the invention that achieves the above object, there is also provided a processor comprising a flip-flop control circuit and a digital circuit according to the first, second, or third embodiment of the invention described above.

According to the invention that achieves the above object, there is also provided a method for operating a processor that comprises a plurality of flip-flops and a pulse generating circuit for generating a first clock pulse signal of a base frequency and a high-frequency processing second clock pulse signal having a frequency higher than the base frequency, the method comprising the steps of: when determining the states of the plurality of flip-flops, setting a control signal and starting counting either the first clock pulse signal or the second clock pulse signal upon receiving an activation signal thereof; clearing the setting of the control signal after a predetermined time has elapsed from the start of the counting; selecting either the first clock pulse signal or the second clock pulse signal in accordance with the control signal; and supplying the selected clock pulse signal to the plurality of flip-flops.

According to the invention that achieves the above object, there is also provided a method for operating a processor that comprises a plurality of flip-flops and a generating circuit for generating a clock pulse signal of a base frequency, the method comprising the steps of: when determining the states of the plurality of flip-flops, setting a control signal and starting counting the clock pulse signal upon receiving an activation signal thereof; after the start of the counting, changing the setting of the control signal at each expiration of a predetermined time; and distributing the clock pulse signal to the plurality of flip-flops in sequence in accordance with the control signal.

According to the invention that achieves the above object, there is also provided a method for operating a processor that comprises a plurality of flip-flops and a generating circuit for generating a clock pulse signal of a base frequency, the method comprising the steps of: when determining the states of the plurality of flip-flops, setting a control signal and starting counting the clock pulse signal upon receiving an activation signal thereof; after the start of the counting, changing the setting of the control signal at each expiration of a predetermined time; and distributing a reset signal to the plurality of flip-flops in sequence in accordance with the control signal.

BRIEF DESCRIPTION OF THE DRAWINGS

Further features and advantages of the present invention will be apparent from the following description with reference to the accompanying drawings, in which.

DESCRIPTION OF THE PREFERRED EMBODIMENTS

Embodiments of the present invention will be described in detail below with reference to the accompanying drawings.

Figure 1:
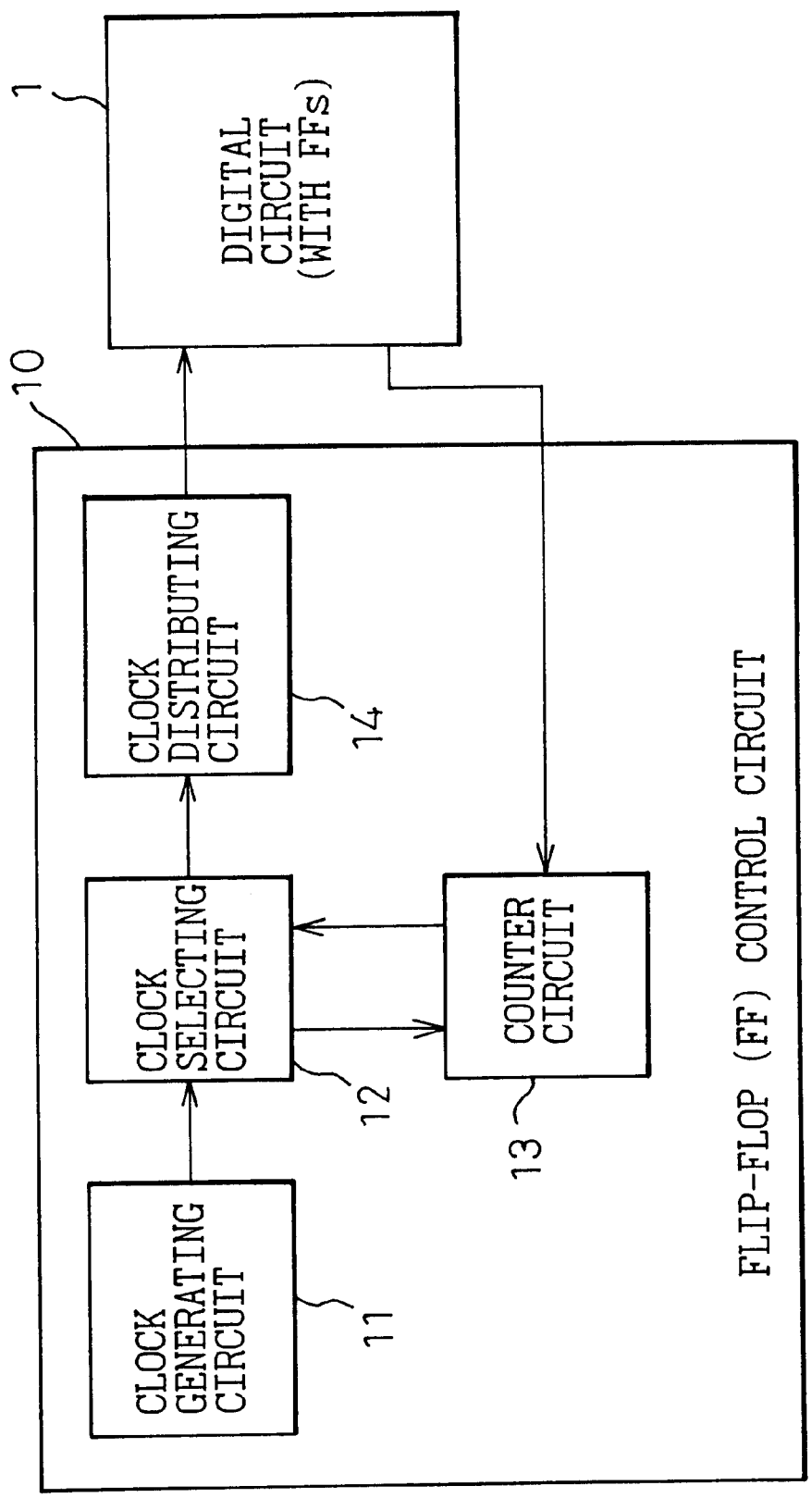
FIG. 1 is a schematic diagram of a flip-flop control circuit according to a first embodiment of the present invention.
Figure 5:
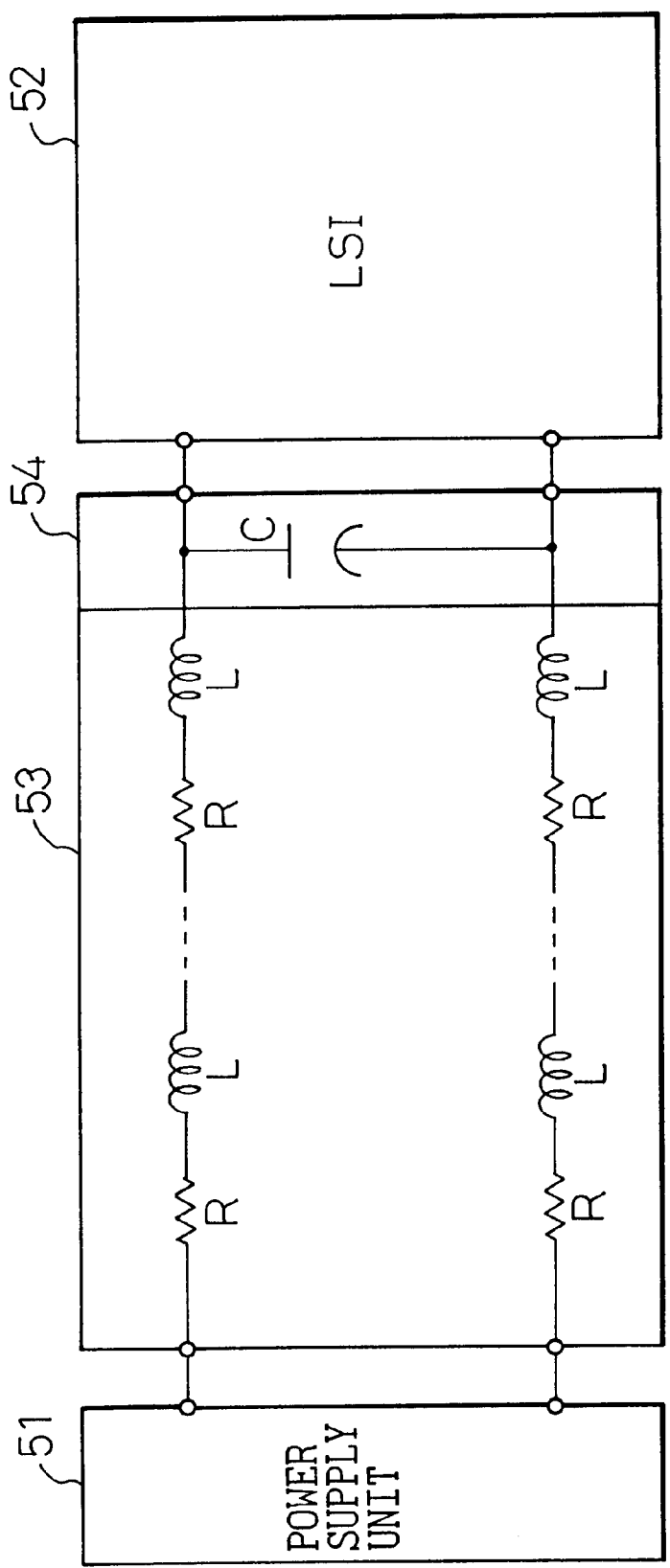
FIG. 5 is a diagram of a power supply circuit commonly used in a computer comprising a CMOS LSI.

FIG. 1 is a schematic diagram of a flip-flop control circuit according to a first embodiment of the present invention. As shown in FIG. 1, the flip-flop (FF) control circuit 10 is connected to a digital circuit 1 having a plurality of flip-flops. The FF control circuit 10 comprises a clock generating circuit 11, a clock selecting circuit 12, a counter circuit 13, and a clock distributing circuit 14. The FF control circuit 10 and the digital circuit 1 are supplied with a DC voltage $V_{dd}$ from a power supply (not shown) similar to the one described with reference to FIG. 5.

The clock generating circuit 11 includes an oscillator, such as a crystal oscillator, for generating an oscillating pulse signal with a predetermined frequency, for example, with a period of 10 ns, and generates a first clock pulse signal of a base frequency that is identical with the frequency of the oscillating pulse signal.

The clock selecting circuit 12 receives the first clock pulse signal from the clock generating circuit 11, generates a high-speed processing second clock pulse signal having a frequency higher than the base frequency with, for example, a period of 5 ns, and outputs the first clock pulse signal or the second clock pulse signal in accordance with a control signal input to it. The clock selecting circuit 12 comprises a known PLL (Phase-Locked Loop) consisting of, for example, a phase comparator, a low-pass filter, and a voltage-controlled oscillator.

The counter circuit 13 receives the first clock pulse signal or the second clock pulse signal from the clock selecting circuit 12; when determining the states of the plurality of flip-flops, for example, when scanning FFs in the computer, or at the time of IPL, the counter circuit 13 sets the control signal and starts counting the clock pulses upon receiving an activation signal issued, for example, from a CPU in the digital circuit 1, and clears the setting of the control signal upon the expiration of a predetermined time of $T_{delta}$ seconds. Here, the predetermined time of $T_{delta}$ seconds is set equal to the time required from the moment that the clock pulse signal as the signal for determining the states of the plurality of flip-flops in the digital circuit 1 is started to be supplied to the flip-flops, until the supply voltage settles down after once dropping, for example, several tens of microseconds.

The clock distributing circuit 14 receives the first clock pulse signal or the second clock pulse signal from the clock selecting circuit 12, and supplies the clock pulse signal as the signal for determining the states of the plurality of flip-flops in the digital circuit 1 to the flip-flops.

Since the current consumption of the flip-flops increases as the frequency of the clock pulse signal increases, the control signal is set as described below, to reduce power supply noise. That is, when the control signal supplied from the counter circuit 13 to the clock selecting circuit 12 is set to 1, the clock selecting circuit 12 outputs the first clock pulse signal to the clock distributing circuit 14, and when the control signal is reset to 0, the clock selecting circuit 12 outputs the second clock pulse signal. Accordingly, during the period of $T_{delta}$ seconds after issuing the activation signal to determine the states of the flip-flops, the low-frequency first clock pulse signal is supplied to the flip-flops in the digital circuit 1, and after the $T_{delta}$ seconds have elapsed, the high-frequency second clock pulse signal is supplied. There are two kinds of activation signals issued to determine the states of the flip-flops: one is the activation signal issued to switch from slow-speed processing mode to high-speed processing mode, and the other is the activation signal issued to switch from high-speed processing mode to slow-speed processing mode. The former activation signal is the one used in the above-described first embodiment.

In an alternative embodiment, when the latter activation signal occurs, the clock selecting circuit 12 outputs the second clock pulse signal to the clock distributing circuit 14 when the control signal supplied from the counter circuit 13 to the clock selecting circuit 12 is set to 1, and outputs the first clock pulse signal when the control signal is reset to 0. Accordingly, during the period of $T_{delta}$ seconds after issuing the activation signal to determine the states of the flip-flops, the high-frequency second clock pulse signal is supplied to the flip-flops in the digital circuit 1, and after the $T_{delta}$ seconds have elapsed, the low-frequency first clock pulse signal is supplied.

Figure 2:
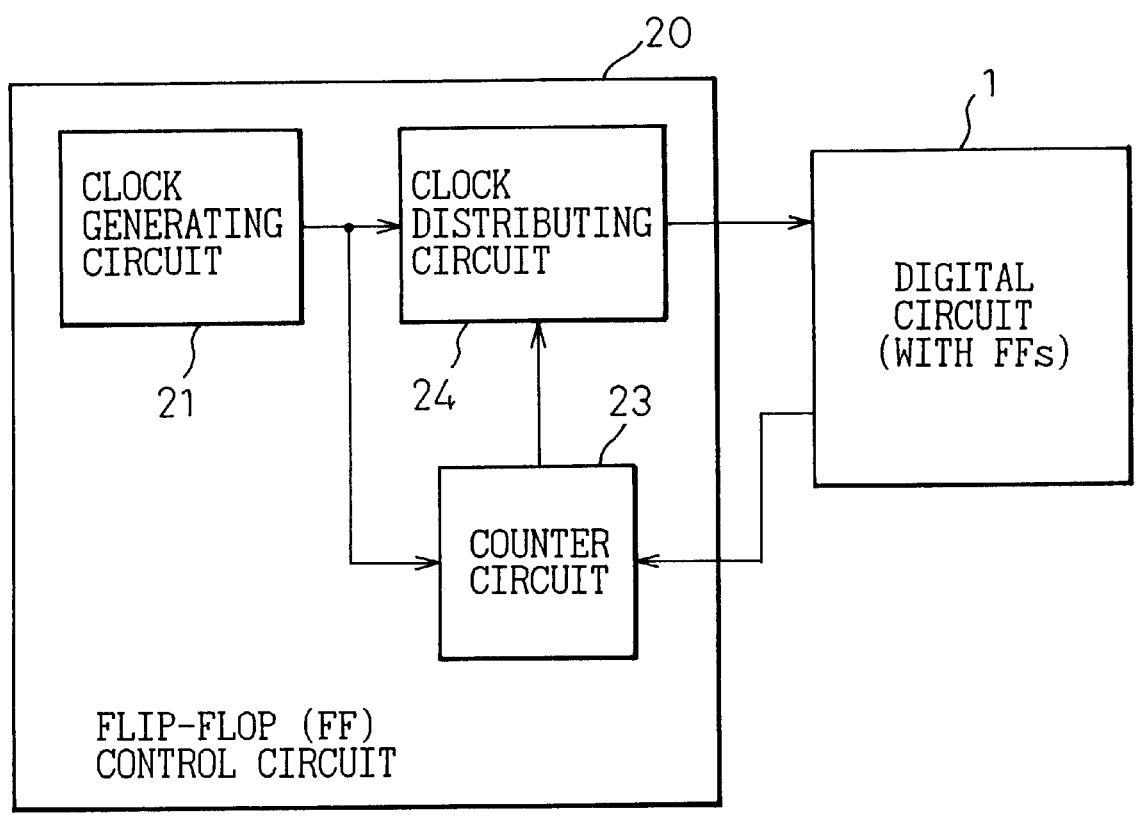
FIG. 2 is a schematic diagram of a flip-flop control circuit according to a second embodiment of the present invention.

FIG. 2 is a schematic diagram of a flip-flop control circuit according to a second embodiment of the present invention. As shown in FIG. 2, the flip-flop (FF) control circuit 20 is connected to a digital circuit 1 having a plurality of flip-flops. The FF control circuit 20 comprises a clock generating circuit 21, a counter circuit 23, and a clock distributing circuit 24. The FF control circuit 20 and the digital circuit 1 are supplied with a DC supply voltage $V_{dd}$ such as described with reference to FIG. 5.

The clock generating circuit 21 generates a clock pulse signal of a base frequency.

The counter circuit 23 receives the clock pulse signal from the clock generating circuit 21; when determining the states of the plurality of flip-flops in the digital circuit 1, for example, when scanning FFs in the computer, or at the time of IPL, the counter circuit 23 sets the control signal and starts counting the clock pulses upon receiving an activation signal issued, for example, from a CPU in the digital circuit 1, and changes the setting of the control signal at each expiration of a predetermined time of $T_{delta}$ seconds. The predetermined time of $T_{delta}$ seconds is set as follows. That is, assuming that the setting of the control signal is changed n times (n is an integer not smaller than 2), the predetermined time of $T_{delta}$ seconds is set so that the time of $n \times T_{delta}$ seconds becomes equal to the time required from the moment that the clock pulse signal as the signal for determining the states of the plurality of flip-flops in the digital circuit 1 is started to be supplied to the flip-flops, until the supply voltage settles down after once dropping.

The clock distributing circuit 24 receives the clock pulse signal from the clock generating circuit 21, and supplies the clock pulse signal as the signal for determining the states of the plurality of flip-flops in the digital circuit 1 to the flip-flops in sequence in accordance with the control signal.

Since the current consumption of the flip-flops increases as the frequency of the clock pulse signal increases, the control signal is set as described below, to reduce power supply noise. That is, when the control signal, for example, a 4-bit signal, input from the counter circuit 23 to the clock distributing circuit 24 is 0000, the clock distributing circuit 24 supplies the clock signal to a first flip-flop array in the digital circuit 1, and when the control signal is 0001, the clock distributing circuit 24 supplies the clock pulse signal to a second flip-flop array as well as to the first flip-flop array in the digital circuit 1; in this way, the number of flip-flop arrays in the digital circuit 1, to which the clock pulse signal is supplied, is gradually increased in accordance with the control signal. As a result, after issuing the activation signal to determine the states of the flip-flops, each time $T_{delta}$ seconds elapse the number of flip-flop arrays to which the clock pulse signal is distributed gradually increases in the digital circuit 1. There are two kinds of activation signals issued to determine the states of the flip-flops: one is the activation signal issued to switch from slow-speed processing mode to high-speed processing mode, and the other is the activation signal issued to switch from high-speed processing mode to slow-speed processing mode. The former activation signal is the one used in the above-described second embodiment.

In an alternative embodiment, when the latter activation signal occurs, the clock distributing circuit 24 supplies the clock signal to the first to 16th flip-flop arrays in the digital circuit 1 when the control signal, for example, a 4-bit signal, input from the counter circuit 23 to the clock distributing circuit 24 is 1111, and supplies the clock pulse signal to the first to 15th flip-flop arrays in the digital circuit 1 when the control signal is 1110; in this way, the number of flip-flop arrays in the digital circuit 1, to which the clock pulse signal is supplied, is gradually reduced in accordance with the control signal. As a result, after issuing the activation signal to determine the states of the flip-flops, each time $T_{delta}$ seconds elapse the number of flip-flop arrays to which the clock pulse signal is distributed gradually decreases in the digital circuit 1.

Figure 3:
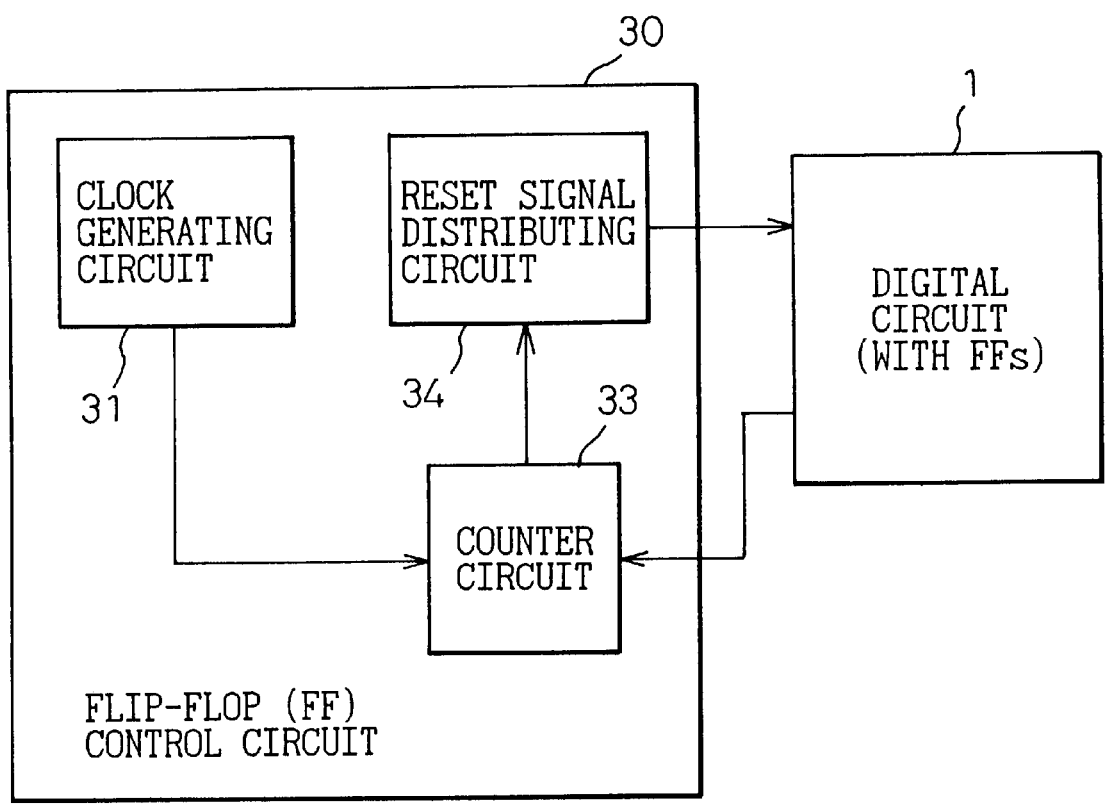
FIG. 3 is a schematic diagram of a flip-flop control circuit according to a third embodiment of the present invention.

FIG. 3 is a schematic diagram of a flip-flop control circuit according to a third embodiment of the present invention. As shown in FIG. 3, the flip-flop (FF) control circuit 30 is connected to a digital circuit 1 having a plurality of flip-flops. The FF control I-circuit 30 comprises a clock generating circuit 31, a counter circuit 33, and a reset signal distributing circuit 34. The FF control circuit 30 and the digital circuit 1 are supplied with a DC supply voltage $V_{dd}$ such as described with reference to FIG. 5.

The clock generating circuit 31 generates a clock pulse signal of a base frequency.

The counter circuit 33 receives the clock pulse signal from the clock generating circuit 31; when determining the states of the plurality of flip-flops in the digital circuit 1, for example, when scanning the computer, or at the time of IPL, the counter circuit 33 sets the control signal and starts counting the clock pulses upon receiving an activation signal from a CPU in the digital circuit 1, and changes the setting of the control signal at each expiration of a predetermined time of $T_{delta}$ seconds. Here, the predetermined time of $T_{delta}$ seconds is set equal to the time required from the moment that the reset signal as the signal for determining the states of the plurality of flip-flops in the digital circuit 1 is started to be supplied to the flip-flops, until the supply voltage settles down after once dropping.

The reset signal distributing circuit 34 distributes the reset signal as the signal for determining the states of the plurality of flip-flops in the digital circuit 1 to the flip-flops in sequence in accordance with the control signal.

Since the current consumption of the flip-flops increases as the frequency of the clock pulse signal increases, the control signal is set as described below, to reduce power supply noise. That is, when the control signal, for example, a 4-bit signal, input from the counter circuit 33 to the reset signal distributing circuit 34 is 0000, the reset signal distributing circuit 34 supplies the reset signal to a first flip-flop array in the digital circuit 1 and, when the control signal is 0001, the reset signal distributing circuit 34 supplies the reset signal to a second flip-flop array as well as to the first flip-flop array in the digital circuit 1; in this way, the number of flip-flop arrays in the digital circuit 1, to which the reset signal is supplied, is gradually increased in accordance with the control signal. As a result, after issuing the activation signal to determine the states of the flip-flops, each time $T_{delta}$ seconds elapse the number of flip-flop arrays to which the reset signal is distributed gradually increases in the digital circuit 1.

In the above-described first to third embodiments, the digital circuit 1 shown in FIGS. 1 to 3 comprises at least one LSI.

Further, in the first to third embodiments, the flip-flop control circuits shown in FIGS. 1 to 3 may each be fabricated on the same LSI chip as the digital circuit 1.

Figure 4A:
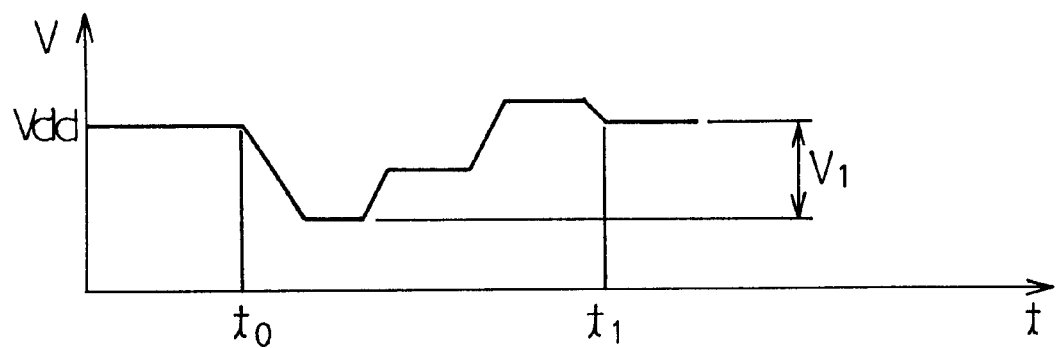
FIG. 4A is a diagram showing a supply voltage waveform according to the prior art.
Figure 4B:
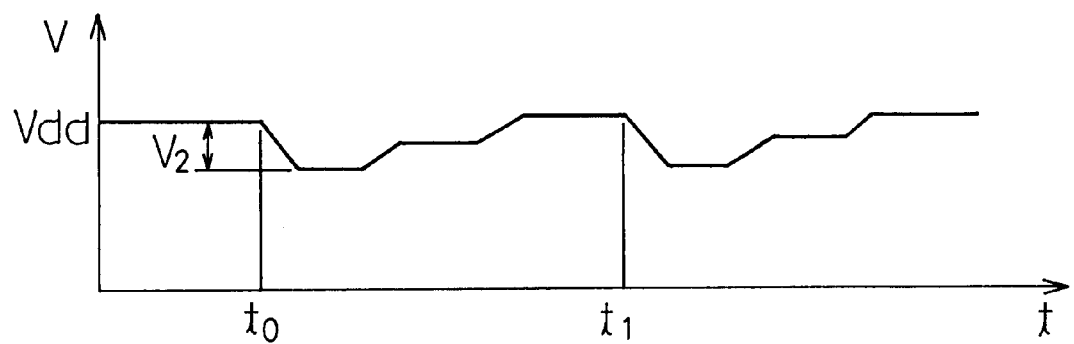
FIG. 4B is a diagram showing a supply voltage waveform according to the present invention.

FIG. 4A is a diagram showing a supply voltage waveform according to the prior art, and FIG. 4B is a diagram showing a supply voltage waveform according to the present invention. As shown in FIG. 4A, when the clock pulse or reset signal as the signal for determining the states of the plurality of flip-flops in the digital circuit 1 of FIGS. 1 to 3 is supplied to the flip-flops at time to without using the flip-flop control circuit of the present invention such as described with reference to FIGS. 1 to 3, the supply voltage $V_{dd}$ drops by a voltage $V_1$ and then settles down at time $t_1$ when the predetermined time of $T_{delta}$ seconds has elapsed.

On the other hand, as shown in FIG. 4B, when the clock pulse or reset signal as the signal for determining the states of the plurality of flip-flops in the digital circuit 1 of FIGS. 1 to 3 is supplied to the flip-flops at time $t_0$ by using the flip-flop control circuit of the present invention, the supply voltage $V_{dd}$ drops by a voltage $V_2$ ($V_2 \ll V_1$) and then settles down at time $t_1$ when the predetermined time of $T_{delta}$ seconds has elapsed. As can be seen, the supply voltage drop at to shown in FIG. 4B is reduced compared with that shown in FIG. 4A.

As described above, according to the present invention, it becomes possible to provide a flip-flop control circuit for reducing low-frequency power supply noise, a processor incorporating the flip-flop control circuit, and a method for operating the processor; thus, the invention provides means to prevent malfunctioning due to noise and improves the reliability of the processor.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A flip-flop control circuit, connected to a digital circuit having a plurality of flip-flops, for supplying said digital circuit with a signal that determines the states of said plurality of flip-flops, comprising:
   a clock generating circuit which generates a first clock pulse signal of a base frequency;
   a clock selecting circuit which receives said first clock pulse signal from said clock generating circuit, and which generates from said received first clock pulse signal a high-speed processing second clock pulse signal having a frequency higher than said base frequency, and outputs said first clock pulse signal or said second clock pulse signal in accordance with a control signal input thereto;
   a counter circuit which receives said first clock pulse signal or said second clock pulse signal from said clock selecting circuit, and which, when determining the states of said plurality of flip-flops, sets said control signal and starts counting said received clock pulse signal upon receiving an activation signal thereof, and clears the setting of said control signal upon expiration of a predetermined time; and
   a clock distributing circuit which receives said first clock pulse signal or said second clock pulse signal from said clock selecting circuit, and which distributes said received clock pulse signal to said plurality of flip-flops.

2. A flip-flop control circuit, connected to a digital circuit having a plurality of flip-flops, for supplying said digital circuit with a signal that determines the states of said plurality of flip-flops, comprising:
   a clock generating circuit which generates a clock pulse signal of a base frequency;
   a counter circuit which receives said clock pulse signal from said clock generating circuit, and which, when determining the states of said plurality of flip-flops, sets a control signal and starts counting said received clock pulse signal upon receiving an activation signal thereof, and changes the setting of said control signal at each expiration of a predetermined time; and
   a clock distributing circuit which receives said clock pulse signal from said clock generating circuit, and which distributes said clock pulse signal to said plurality of flip-flops in sequence in accordance with said control signal.

3. A flip-flop control circuit, connected to a digital circuit having a plurality of flip-flops, for supplying said digital circuit with a signal that determines the states of said plurality of flip-flops, comprising:
   a clock generating circuit which generates a clock pulse signal of a base frequency;
   a counter circuit which receives said clock pulse signal from said clock generating circuit, and which, when determining the states of said plurality of flip-flops, sets a control signal and starts counting said received clock pulse signal upon receiving an activation signal thereof, and changes the setting of said control signal at each expiration of a predetermined time; and a reset signal distributing circuit which distributes a reset signal to said plurality of flip-flops in sequence in accordance with said control signal.

4. A flip-flop control circuit as claimed in any one of claims 1 to 3, wherein said digital circuit comprises at least one LSI.

5. A processor comprising an LSI that contains a flip-flop control circuit and a digital circuit as claimed in any one of claims 1 to 3.

6. A method for operating a processor that comprises a plurality of flip-flops and a pulse generating circuit for generating a first clock pulse signal of a base frequency and a high-frequency processing second clock pulse signal having a frequency higher than said base frequency, said method comprising the steps of:

when determining the states of said plurality of flip-flops, setting a control signal and starting counting either said first clock pulse signal or said second clock pulse signal upon receiving an activation signal thereof;

clearing the setting of said control signal after a predetermined time has elapsed from the start of said counting;

selecting either said first clock pulse signal or said second clock pulse signal in accordance with said control signal; and supplying said selected clock pulse signal to said plurality of flip-flops.

7. A method for operating a processor that comprises a plurality of flip-flops and a generating circuit for generating a clock pulse signal of a base frequency, said method comprising the steps of:

when determining the states of said plurality of flip-flops, setting a control signal and starting counting said clock pulse signal upon receiving an activation signal thereof;

after the start of said counting, changing the setting of said control signal at each expiration of a predetermined time; and distributing said clock pulse signal to said plurality of flip-flops in sequence in accordance with said control signal.

8. A method for operating a processor that comprises a plurality of flip-flops and a generating circuit for generating a clock pulse signal of a base frequency, said method comprising the steps of:

when determining the states of said plurality of flip-flops, setting a control signal and starting counting said clock pulse signal upon receiving an activation signal thereof;

after the start of said counting, changing the setting of said control signal at each expiration of a predetermined time; and distributing a reset signal to said plurality of flip-flops in sequence in accordance with said control signal.

* * * * *